United States Patent
Chen et al.

(10) Patent No.: US 9,620,482 B1
(45) Date of Patent: Apr. 11, 2017

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Yu-Jen Chen, Hsinchu County (TW); Hsien-Wei Chen, Hsinchu (TW); Der-Chyang Yeh, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/886,560

(22) Filed: Oct. 19, 2015

(51) Int. Cl.
  *H01L 21/78* (2006.01)
  *H01L 25/065* (2006.01)
  *H01L 25/00* (2006.01)

(52) U.S. Cl.
  CPC .......... *H01L 25/0657* (2013.01); *H01L 21/78* (2013.01); *H01L 25/50* (2013.01); *H01L 2225/06555* (2013.01); *H01L 2225/06582* (2013.01); *H01L 2225/06589* (2013.01)

(58) Field of Classification Search
  CPC ....... G11C 5/025; G11C 5/063; G11C 7/1096; G11C 7/1069; G11C 7/12; H01L 25/50; H01L 25/18; H01L 25/0657; H01L 2225/06541; H01L 2225/06548; H01L 2225/06589; H01L 23/544; H01L 2924/0002; H01L 2924/00; G01B 11/27; G01B 11/30; G03F 7/20; G03F 7/70633
  See application file for complete search history.

(56) References Cited

U.S. PATENT DOCUMENTS 8,039,943 B2 * 10/2011 Harayama ............. H01L 21/565
  257/686

* cited by examiner

*Primary Examiner* — Roy Potter
(74) *Attorney, Agent, or Firm* — WPAT, P.C., Intellectual Property Attorneys; Anthony King

(57) ABSTRACT

A semiconductor device includes a plurality of semiconductor dies stacked vertically to have a vertical height and a dielectric surrounding the stacked semiconductor dies. The semiconductor device further has a conductive post external to the stacked semiconductor dies and extending through the dielectric. In the semiconductor device, a height of the conductive post is greater than the vertical height.

17 Claims, 21 Drawing Sheets

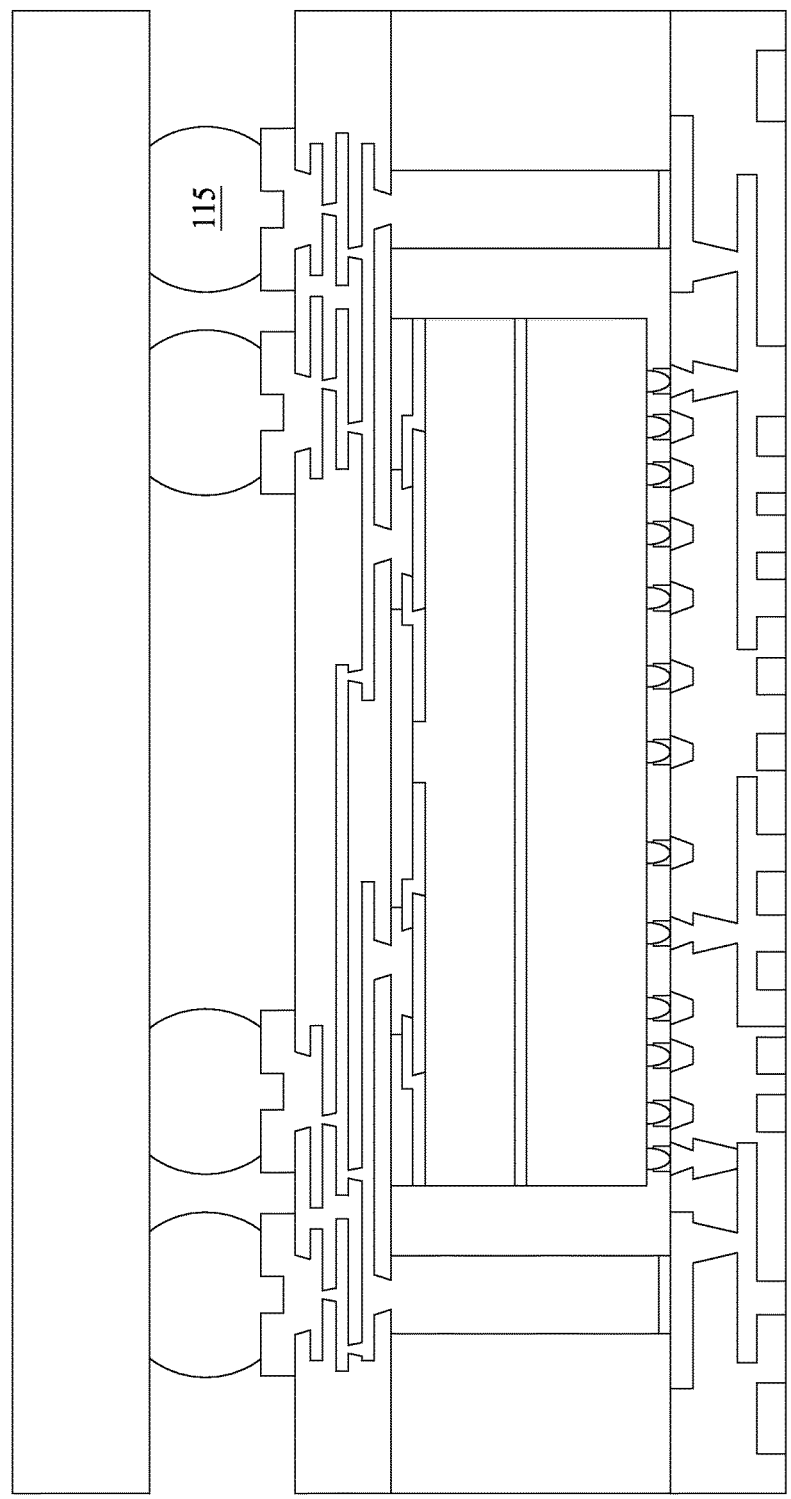

SEMICONDUCTOR DEVICE AND MANUFACTURING METHOD THEREOF

PRIORITY CLAIM AND CROSS-REFERENCE

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipments includes more and more steps of assembly and processing as well as materials for producing the semiconductor devices in the electronic equipments. Therefore, there is a continuous demand on simplifying the steps of production, increasing production efficiency and lowering associated manufacturing cost on each electronic equipment.

During the operations of manufacturing the semiconductor devices, the semiconductor devices are assembled with numbers of integrated components including various materials with difference in thermal properties. As such, the integrated components are in undesired configurations after curing of the semiconductor device. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A-FIG. 7G are flow diagrams of a method of manufacturing a semiconductor device in accordance with some embodiments.

DETAILED DESCRIPTION

Figure 1:
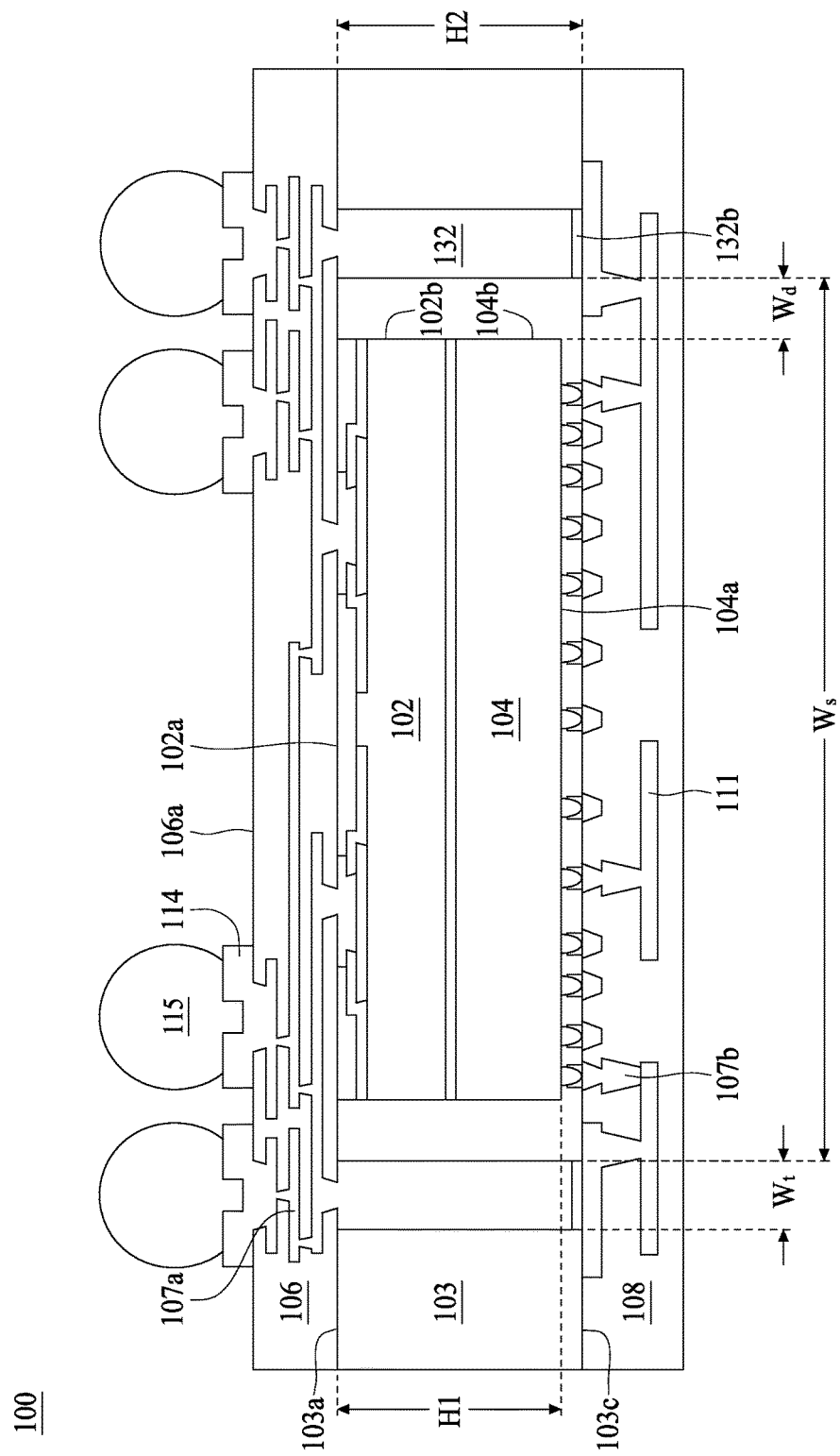
FIG. 1 is a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a 3D semiconductor device is provided to accumulate a plurality of semiconductor components. The semiconductor components are vertically stacked in order to reduce the area needed for semiconductor device. The semiconductor components in the semiconductor device electrically communicate with each other by at least one through conductive post, wherein the conductive post is extended upwardly along the thickness of the stacked components. The conductive post can be extended substantially higher than a stacked height of the semiconductor components. The stacked height might include respective thickness of each component and thickness of other adhesive or insulative material disposed between or under/over the semiconductor components. Through the high conductive post, a more effective approach is provided to manufacture a 3D semiconductor device.

In FIG. 1, a semiconductor device 100 with a plurality of semiconductor components is illustrated. The semiconductor device 100 includes a first component 102 and a second component 104. In some embodiments, the first component 102 may be a system on chip (SoC), and the SoC is an integrated circuit (IC) that integrates all components of a computer or other electronic systems into a single chip. In some embodiments, the second component 104 may be a memory device like flash memory or dynamic random-access memory (DRAM), and the DRAM is a type of random-access memory that stores each bit of data in a separate capacitor within an integrated circuit. The first component 102 and the second component 104 may be stacked vertically along the thickness of each component. In some embodiments, the vertical direction is defined as the direction extending along a normal direction of an active surface 102a of the first component 102. In some embodiments, the stacked component may have a vertical height H1 as in FIG. 1. The active surface 102a is defined as the surface including major contacts such as bond pad, RDL, UBM, etc. configured to be connected with other components or conductive traces external to the first component 102.

In the present disclosure, the first component 102 and the second component 104 may be stacked backside to backside (back-to-back stacking), and the first component 102 has the active surface 102a faced oppositely from the direction, which an active surface 104a of the second component 104 has faced. Similar to the active surface 102a, active surface 104a is defined as the surface including major contacts such as bond pad, RDL, UBM, etc. configured to be connected with other components or conductive traces external to the second component 104. In some embodiments, an adhesive may be disposed between the first component 102 and the second component 104 to prevent a relative movement.

In the present disclosure, a sidewall 102b of the first component 102 and a sidewall 104b of the second component 104 are surrounded by a middle level molding 103. In some embodiments, a first surface 103a of the middle level molding 103 is substantially coplanar with the top surface 102a of the first component 102. In some embodiments, a dielectric 106 is over the active surface 102a of the first component 102 and the first surface 103a of the middle level molding 103. In some embodiments, another dielectric 108 is over the active surface 104a of the second component 104 and a second surface 103c of the middle level molding 103. The middle level molding 103 is sandwiched between the dielectric 106 and the dielectric 108. In some embodiments, dielectric 106 and dielectric 108 include a material such as epoxy, polyimide, polybenzoxazole (PBO), solder resist (SR), ABF film, and the like.

The semiconductor device 100 further includes a conductive post 132 external to the stacked components and extending through the middle level molding 103 as in FIG. 1. In some embodiments, the conductive post 132 is disposed around a region proximal to the stacked components of the first component 102 and the second component 104. In some embodiments, the conductive post 132 is adjacent to the stacked components including the first component 102 and the second component 104. In some embodiments, the conductive post 132 has a height H2, and the height H2 is greater than the height H1 of the stacked components of the first component 102 and the second component 104. In some embodiments, the height H2 may be greater than 250 um. In some embodiments, the height H2 may be greater than 300 um.

In some embodiments, the conductive post 132 is formed from one end and continuously extended upwardly along the direction parallel to the thickness of the stacked components. Only one seed layer is included throughout the conductive post 132. For example, as shown in FIG. 1, there is only one seed layer 132b is observed in each conductive post 132, wherein the seed layer 132b is proximal to the second portion 107b conductive trace. In some embodiment, the seed layer is in the other end of each conductive post 132. Even though the height of the conductive post 132 is over 250 um or even more than 300 um, the conductive post 132 grown in a single plating operation without interruption, which will be explained later in the present disclosure. Thus, only one seed layer is observed in only one end of the conductive post 132.

In some embodiments, there are more than one conductive post 132, and the conductive posts 132 are configured to surround a region for accumulating the stacked components of the first component 102 and the second component 104. In some embodiments, the conductive post 132 is configured to be a support between the dielectric 106 and the dielectric 108. In some embodiments, the conductive post 132 may be a TIV (Through Integrated Fan-out Via). In some embodiments, the conductive post 132 may include copper, aluminum, tungsten, nickel, solder, gold, silver, palladium, platinum, titanium, or alloys thereof.

In some embodiments, the conductive post 132 is in a cylindrical shape with various cross-sectional shapes such as circular shapes, quadrilateral shapes, rectangles, squares, polygonal shapes, or the like. In some embodiments, a width $W_t$ of the conductive post 132 may be less than 285 um. In some embodiments, a spacing $W_s$ between the adjacent conductive post 132 is larger than about 2300 um. In some embodiments, a spacing $W_d$ between the conductive posts 132 and the sidewall 104b of the second component 104 is larger than about 150 um.

In some embodiments, an accumulation percentage is defined as a ratio of a volume of a substance to a specific space. In some embodiments, an accumulation percentage of the stacked component of the first component 102 and the second component 104 to the space between two adjacent conductive posts 132 is about 65% to 95%. In some embodiments, the accumulation percentage is about 75% to 85%. In some embodiments, a sidewall 102b of the first component 102 and a sidewall 104b of the second component 104 are substantially coplanar. In some embodiments, a width of the first component 102 and a width of the second component 104 are substantially the same. In some embodiments, the conductive post 132 is substantially parallel to the sidewall 102b of the first component 102 or the sidewall 104b of the second component 104.

The conductive structure inside the dielectric 106 and the dielectric 108 includes several portions of conductive structures. In some embodiments, a first portion 107a conductive trace is formed in the dielectric 106 to electrically connect the first component 102 to the conductive post 132 or a conductor 115. The first portion 107a is over one side of the stacked component, or over said active surface 102a of the first component 102. The first portion 107a is configured to fan-out the conductive pad of the first component 102. In some embodiments, the first portion 107a conductive trace may be extended to a first surface 106a of the dielectric 106. The first surface 106a is a portion of an external surface of semiconductor device 100. In some embodiments, a bond pad 114 is formed on the first surface 106a in order to receive the conductor 115. The bond pad 114 is also electrically connected to the first portion 107a conductive trace. In some embodiments, the bond pad 114 is an under bump metallurgy (UBM) pad which is a solderable surface for receiving conductor 115. In some embodiments, the bond pad 114 includes gold, silver, copper, nickel, tungsten, aluminum, palladium and/or alloys thereof. On the other side of the stacked component, a second portion 107b conductive trace is formed in the dielectric 108 to electrically connect the second component 104 to the conductive post 132. The second portion 107b conductive trace is over the other side of the stacked component, or over said active surface 104a of the second component 104. The first portion 107b is configured to fan-out the conductive pad of the second component 104. In some embodiments, the second portion 107b conductive trace may be extended into the dielectric 108 so as to be connected to a thermal dissipation pad 111. In some embodiments, the first portion 107a conductive trace and the second portion 107b conductive trace are respectively an RDL (Redistribution Layer), PPI (Post Passivation Interconnect), or interconnection via of the integrated semiconductor package.

The first portion 107a and second portion 107b conductive traces are physically separated by the stacked component and electrically connected by the conductive post 132. The first component 102 and the second component 104 are electrically connected through the first portion 107a conductive trace, the conductive post 132, and the second portion 107b conductive trace. In some embodiments, the first component 102 and second component 104 together perform various functions, such as wireless signal transmission, processing, illuminating, and so on.

In some embodiments, a thermal dissipation pad 111 is optionally disposed in the dielectric 108. The second portion 107b conductive trace connects the thermal dissipation pad 111 to the conductive post 132 and the second component 104. Heat from the first component 102 and the second component 104 may dissipate by the thermal dissipation pad 111 through a path of the first portion 107a conductive trace, the second portion 107b conductive trace and the conductive post 132.

Figure 2:
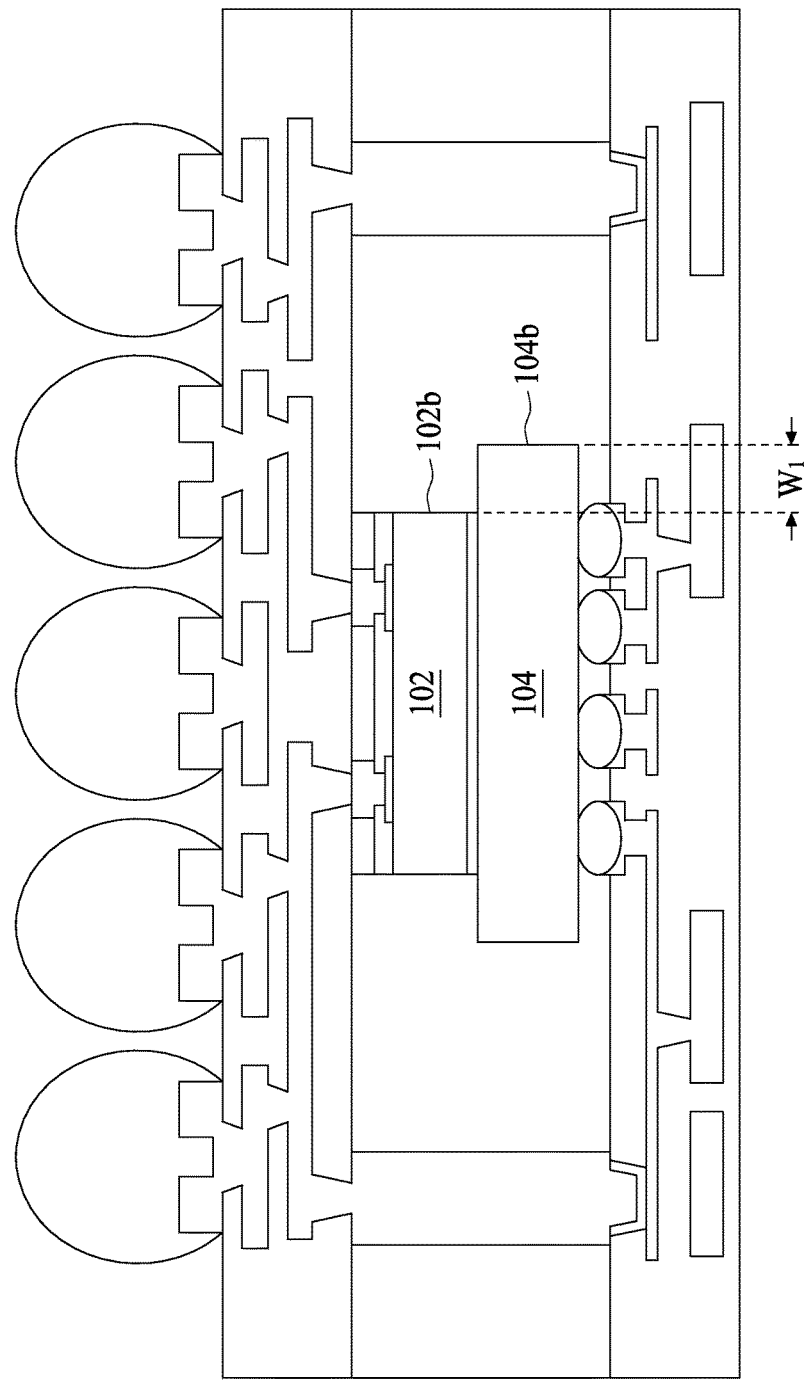
FIG. 2 is a schematic view of a semiconductor device in accordance with some embodiments.

FIG. 2 is an embodiment of a semiconductor device 300. The semiconductor device 300 includes a structure similar to the semiconductor 100 in FIG. 1 such that details of the elements indicated with the same numerical labels are not repeated herein. In some embodiments, a width of the first component 102 may be less than a width of the second component 104. In some embodiments, the width of the first component 102 may be 100 um less than the width of the second component 104. In some embodiments, a center line of the first component 102 and a center line of the second component 104 are collinear. In some embodiments, a distance $W_1$ may be defined as a distance between the sidewall 102b of the first component 102 and the sidewall 104b of the second component 104. In some embodiments, the distance $W_1$ may be greater than about 50 um. In some embodiments, the distance $W_1$ may be about 50 um to 100 um.

Figure 3:
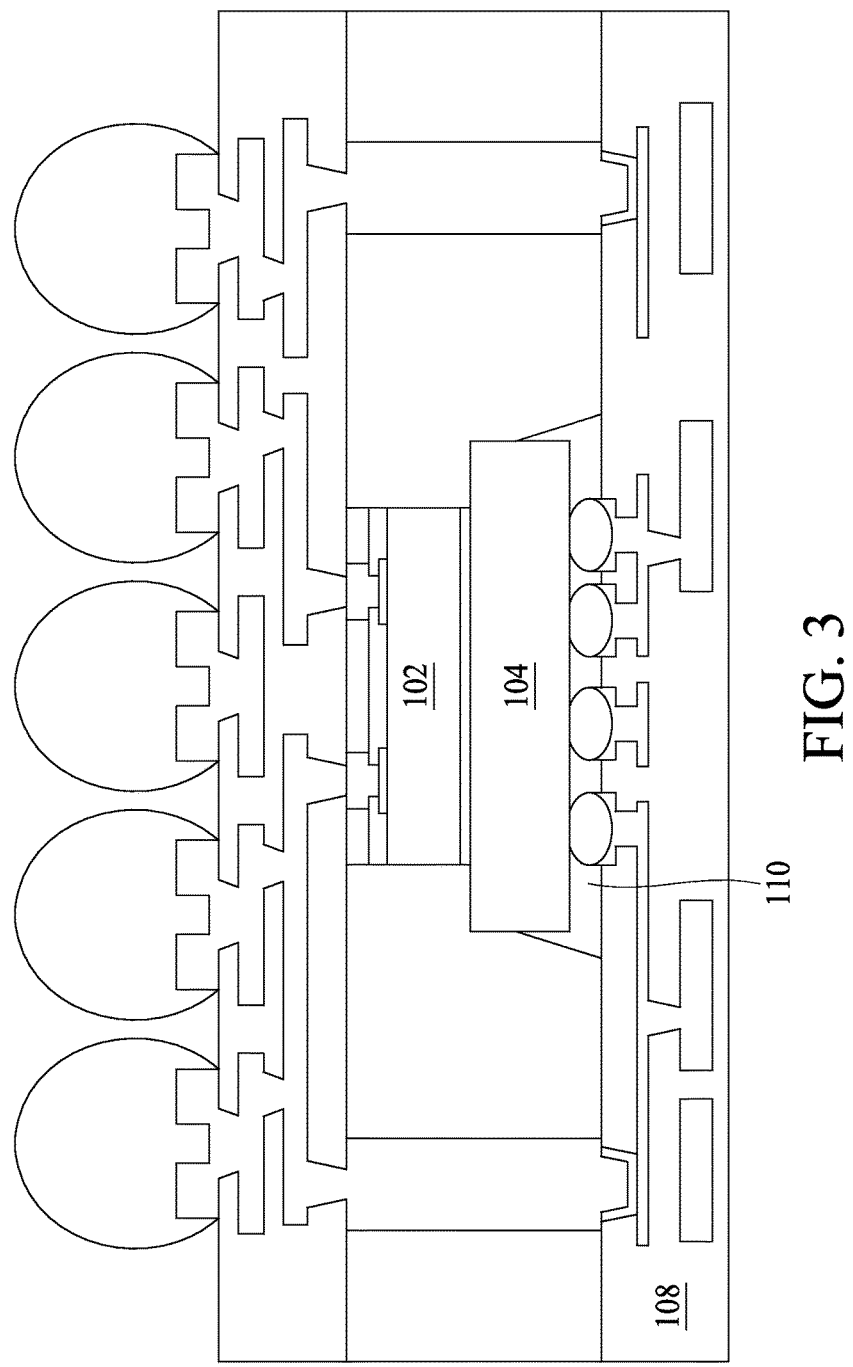
FIG. 3 is a schematic view of a semiconductor device in accordance with some embodiments.

FIG. 3 is an embodiment of a semiconductor device 500. The semiconductor device 500 includes a structure similar to the semiconductor 300 in FIG. 2 such that details of the elements indicated with the same numerical labels are not repeated herein. In some embodiments, an underfill 110 is disposed between the second component 104 and the dielectric 108. The active surface 104a is partially covered by the underfill 110. In some embodiments, the underfill 110 may be configured as a stress relief agent. In some embodiments, the underfill 110 may include expoxy, silica, and metal particle. In some embodiments, the underfill 110 may be disposed by various operations such as injection.

Figure 4:
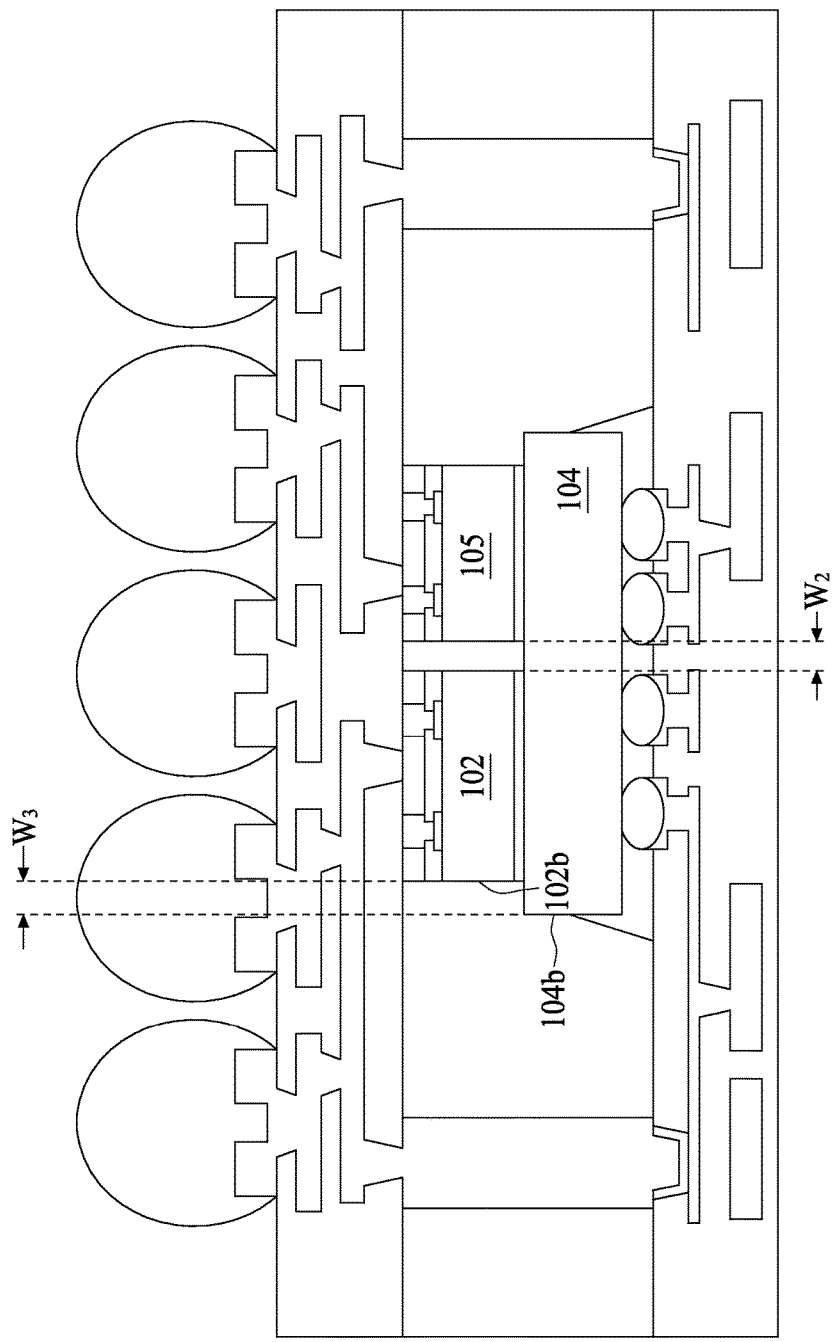
FIG. 4 is a schematic view of a semiconductor device in accordance with some embodiments.

FIG. 4 is an embodiment of a semiconductor device 700. The semiconductor device 700 includes a structure similar to the semiconductor 300 in FIG. 2 such that details of the elements indicated with the same numerical labels are not repeated herein. In the present disclosure, the semiconductor device 700 further includes third component 105. In some embodiments, the third component 105 is stacked on the second component 104 vertically and adjacent to the first component 102. In some embodiments, first component 102 and third component 105 are disposed laterally with a spacing $W_2$. In some embodiments, the spacing $W_2$ may be larger than about 100 um. In some embodiments, a width $W_3$ of a sidewall 102b of the first component 102 and the sidewall 104b of the second component 104 may be greater than 50 um. In some embodiments, there are more than two components disposed over the second component 104. Similar to the first component 102 and the third component 105 over the second component 104. The first component 102 and the third component 105 are laterally arranged over the dummy surface (the surface opposite to active surface 104a). In some embodiments, the first component 102 and third component 105 may be the different type of components. In some embodiments, a width of the second component 104 is substantially equal to or greater than a sum of a width of the first component 102 and a width of the third component 105.

Figure 5A:
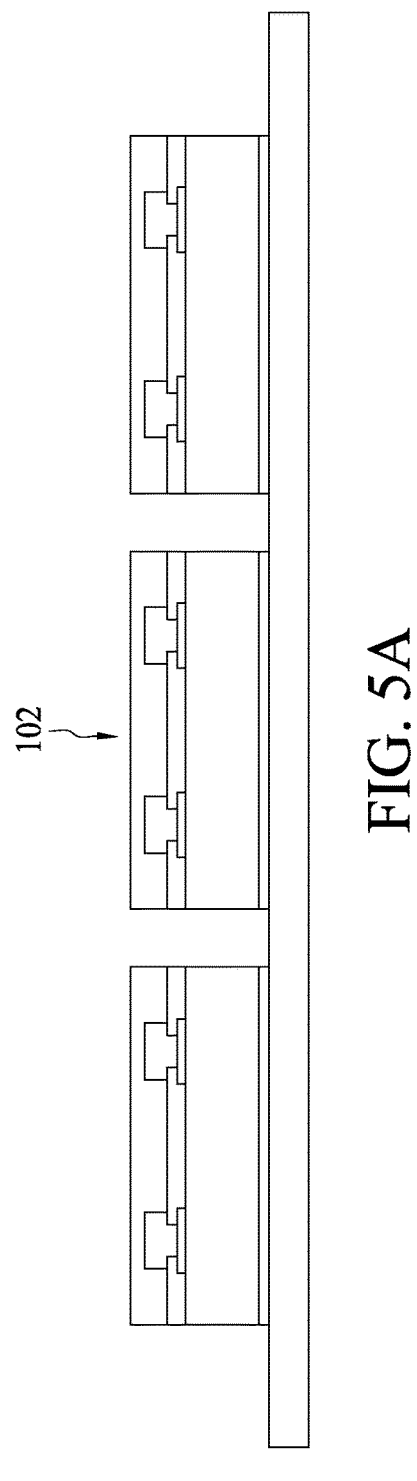
FIG. 5A-FIG. 5D are flow diagrams of a method of manufacturing a stacked component in accordance with some embodiments.
Figure 5B:
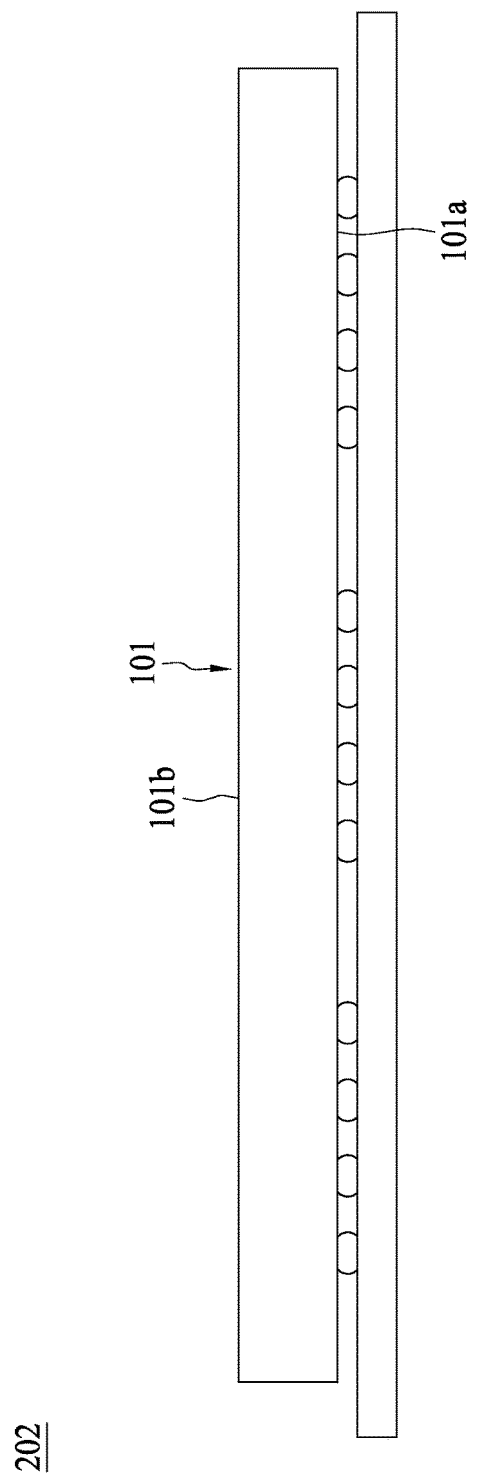
Figure 5C:
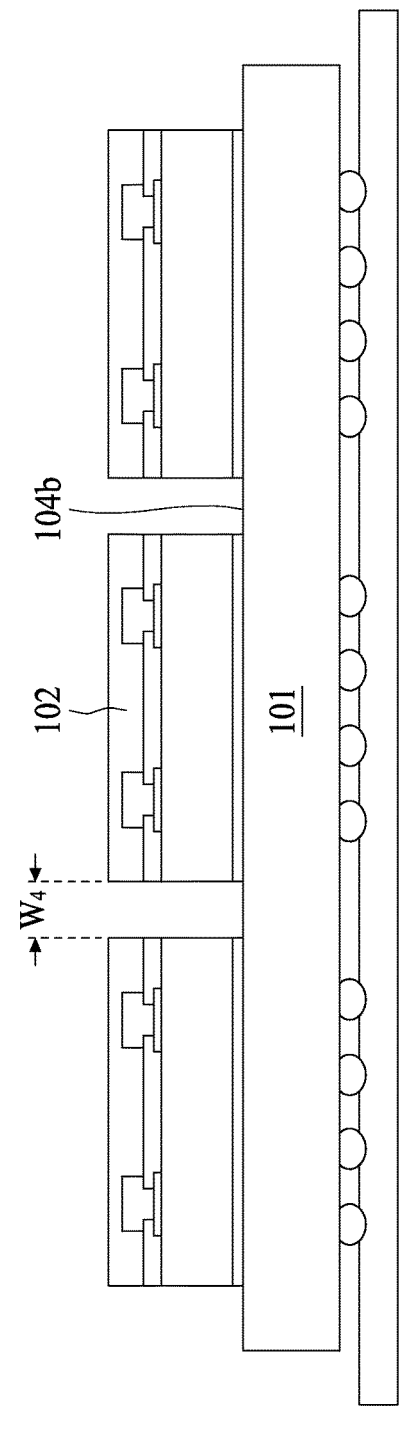

FIG. 5A-FIG. 5D includes operations of a method of manufacturing the stacked component of the first component 102 and the second component 104 in FIG. 2. The method includes a number of operations (201, 202, 203 and 204). In operation 201, several first components 102 are provided as in FIG. 5A. In operation 202, a wafer level package 101 is provided as in FIG. 5B. In some embodiments, the wafer level package 101 includes several second components 104. In some embodiments, the wafer level package 101 has several bumps disposed on an active surface 101a thereof. The wafer level package 101 is flipped over and a bottom surface 101b, which is opposite to the active surface 101a, of the wafer level package 101 is faced upwardly for stacking the first components 102 in FIG. 5A. In operation 203, the first components 102 in FIG. 5A are picked and placed on the bottom surface 101b of the wafer level package 101 as in FIG. 5C. The first components 102 are placed with a spacing $W_4$. In some embodiments, the spacing $W_4$ may be greater than 100 um. In some embodiments, the second components 104 can be singulated as the first component 102 in FIG. 5A while the first components 102 are in a wafer level form. The second components 104 picked and placed on the first component 102. In operation 204, the wafer level package 101 is singulated along the spacing $W_4$ to form several stacked components of the first component 102 and the second component 104 as in FIG. 5D. In some embodiments, the wafer level package 101 is singulated by a mechanical or laser blade.

FIG. 6A-FIG. 6F includes operations of a method of manufacturing a semiconductor device 300 in FIG. 2. The method includes a number of operations (401, 402, 403, 404 405, and 406). In operation 401, a substrate 400 is provided as a carrier or support. The dielectric 108, the thermal dissipation pad 111 and the second portion 107b conductive trace are disposed, as in FIG. 6A over the substrate 400. In some embodiments, the second portion 107b conductive trace is extended upwardly from the thermal dissipation pad 111 to a top surface 108b of the dielectric 108. Later on, a seed layer 132b is deposited on an exposed portion of the second portion 107b conductive trace. The conductive posts 132 are formed on the seed layer 132b and further extended upwardly from the top surface 108b of the dielectric 108. In a wafer level process, the conductive posts 132 are formed in a pre-determined pattern as in FIG. 6A. Some neighboring conductive posts 132 are arranged in an optimized spacing in order to have some electronic components disposed therebetween.

Figure 5D:
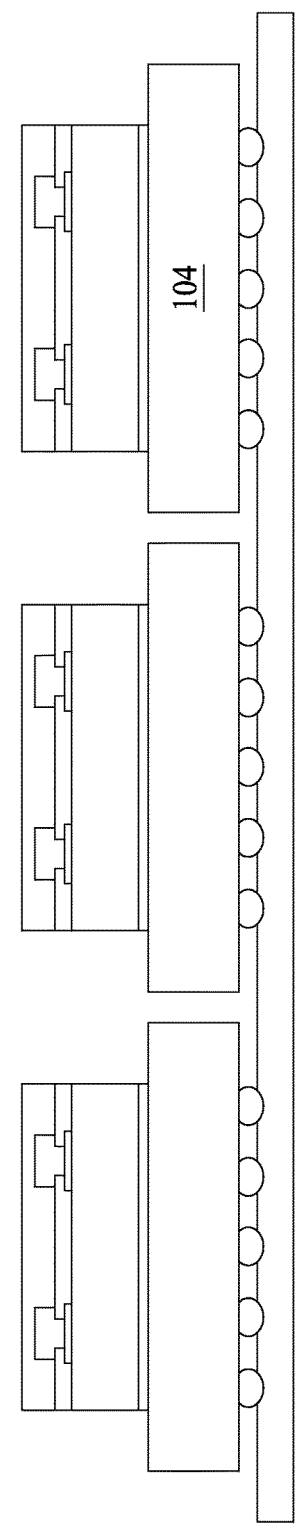
Figure 6A:
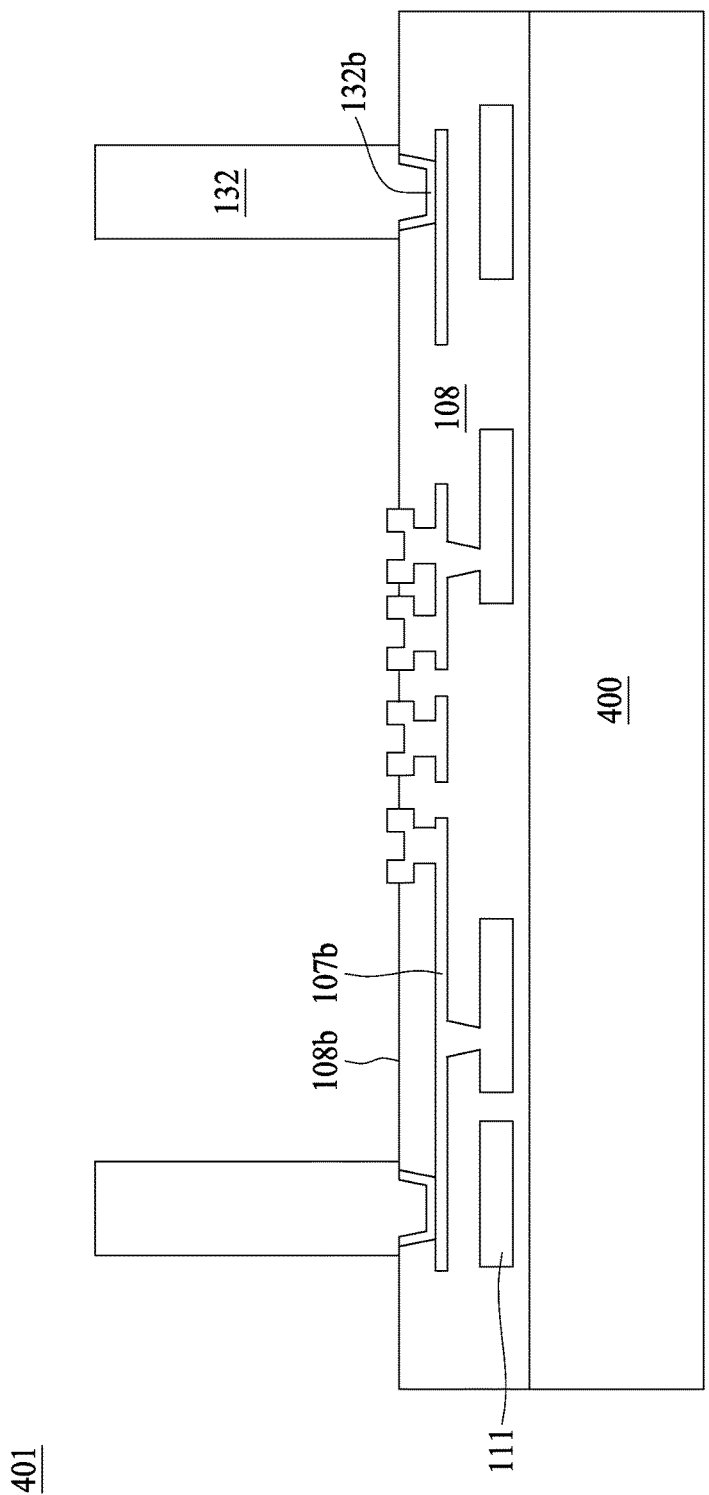
FIG. 6A-FIG. 6F are flow diagrams of a method of manufacturing a semiconductor device in accordance with some embodiments.
Figure 6B:
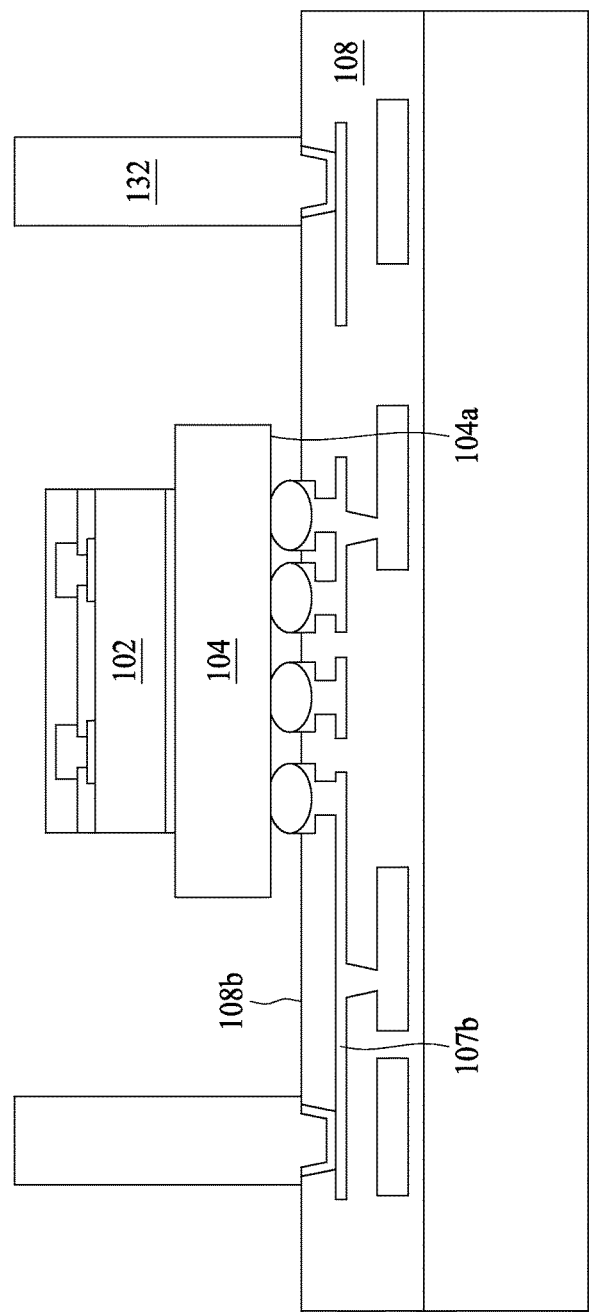

In operation 402, the stacked component including the first component 102 and the second component 104 in FIG. 5D is disposed on the top surface 108b of the dielectric 108 and between the conductive posts 132 as in FIG. 6B. In some embodiments, the top surface 104a of the second component 104 is disposed on the top surface 108b of the dielectric 108. In some embodiments, the second component 104 is electrically connected to the second portion 107b conductive trace.

Figure 6C:
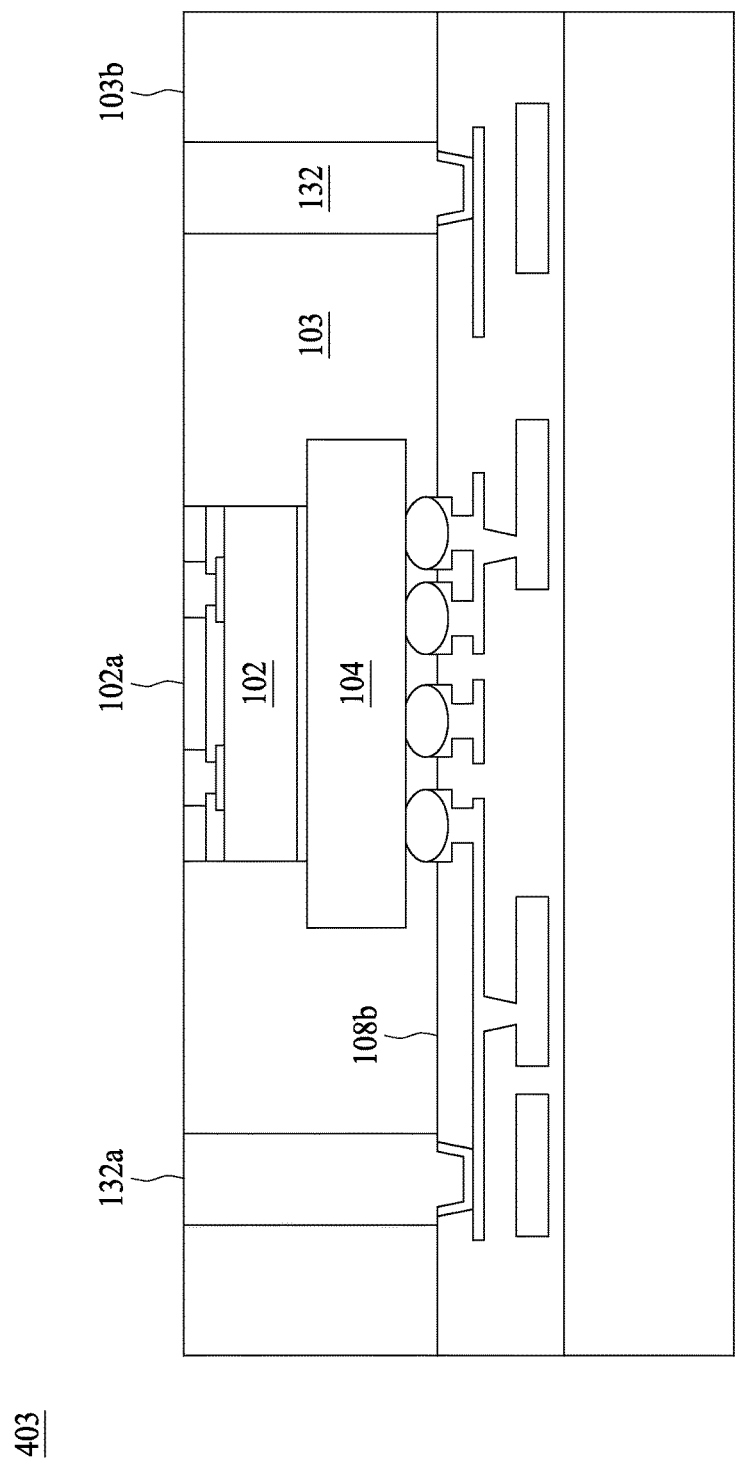

In operation 403, a middle level molding 103 is disposed over the top surface 108b and fills gaps between the conductive posts 132 and the stacked component of the first component 102 and the second component 104, as in FIG. 6C. The molding may overfill to cover the conductive posts 132 and the stacked component of the first component 102 and the second component 104. A removal or planarization operation is introduced to remove a portion of the middle level molding 103 in order to expose the top surface 132a of the conductive posts 132 and the top surface 102a of the first component 102, such that there is no middle level molding 103 remaining on the conductive posts 132 and the first component 102. FIG. 6C is an embodiment showing the structure after the removal operation. In some embodiments, the top portion of the middle level molding 103, the conductive posts 132, and the first component 102 are concurrently removed by an operation such as etching or grinding in order to be coplanar.

Figure 6D:
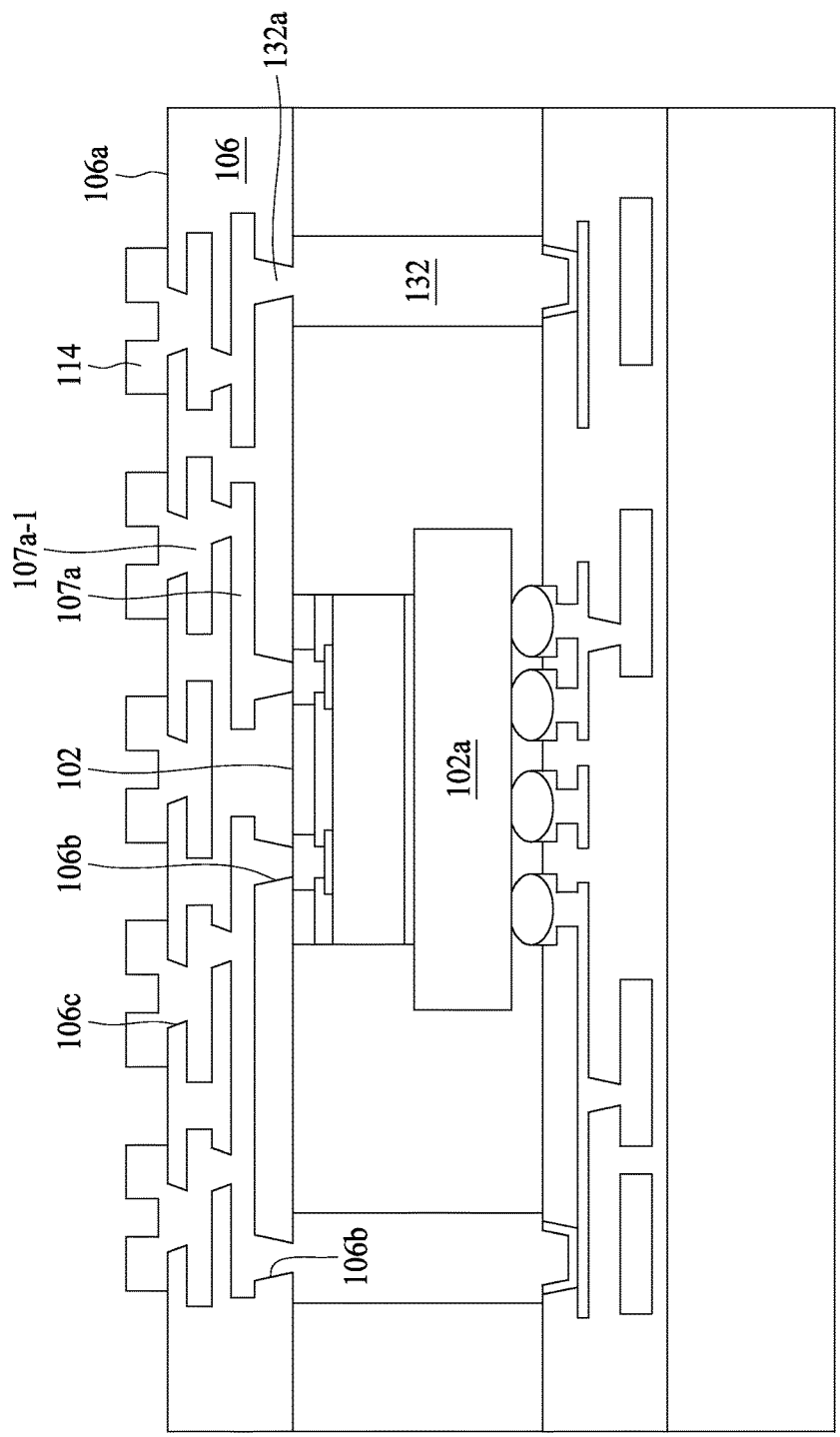

In operation 404, a dielectric 106 is disposed over the middle level molding 103, the conductive posts 132 and the second component 104, as in FIG. 6D. In some embodiments, the middle level molding 103 includes a polymeric material such as epoxy, polyimide, polybenzoxazole (PBO), solder resist (SR), ABF film, and the like. In some embodiments, a recessed portion 106b is formed above the top surface 132a of the conductive posts 132 and the top surface 102a of the first component 102, as in FIG. 6D. In some embodiments, portions of the dielectric 106 above the top surface 132a and the top surface 102a are removed by photolithography.

A first portion 107a conductive trace is disposed as in FIG. 6D. In some embodiments, the first portion 107a conductive trace is disposed on the dielectric 106 by electroplating or sputtering. In some embodiments, the dielectric 106 and the first portion 107a conductive trace may include at least one layer and be disposed orderly in layers, as in FIG. 6D.

In some embodiments, the dielectric 106 is disposed on the first portion 107a conductive trace and covers the top of the semiconductor device. In some embodiments, a via 106c is formed and a bond pad 114 is disposed, as in FIG. 6D. In some embodiments, the via 106c is formed by removing portions of the dielectric 106 above the first portion 107a conductive trace. In some embodiments, a portion of the dielectric 106 is removed by photolithography to form the via 106c. In some embodiments, the via 106c is in a tapered configuration.

In some embodiments, the bond pad 114 is formed above a section 107a-1 of the first portion 107a conductive trace and the dielectric 106. In some embodiments, the bond pad 114 fills the via 106c and extends from the top surface 106a of the dielectric 106 to the section 107a-1 of the first portion 107a conductive trace so that the bond pad 114 is electrically connected with the first portion 107a conductive trace. In some embodiments, the bond pad 114 is an under bump metallurgy (UBM) pad which is a solderable surface for receiving a bump and electrically connecting the bond pad 114 with the circuitry external to the first component 102.

Figure 6E:
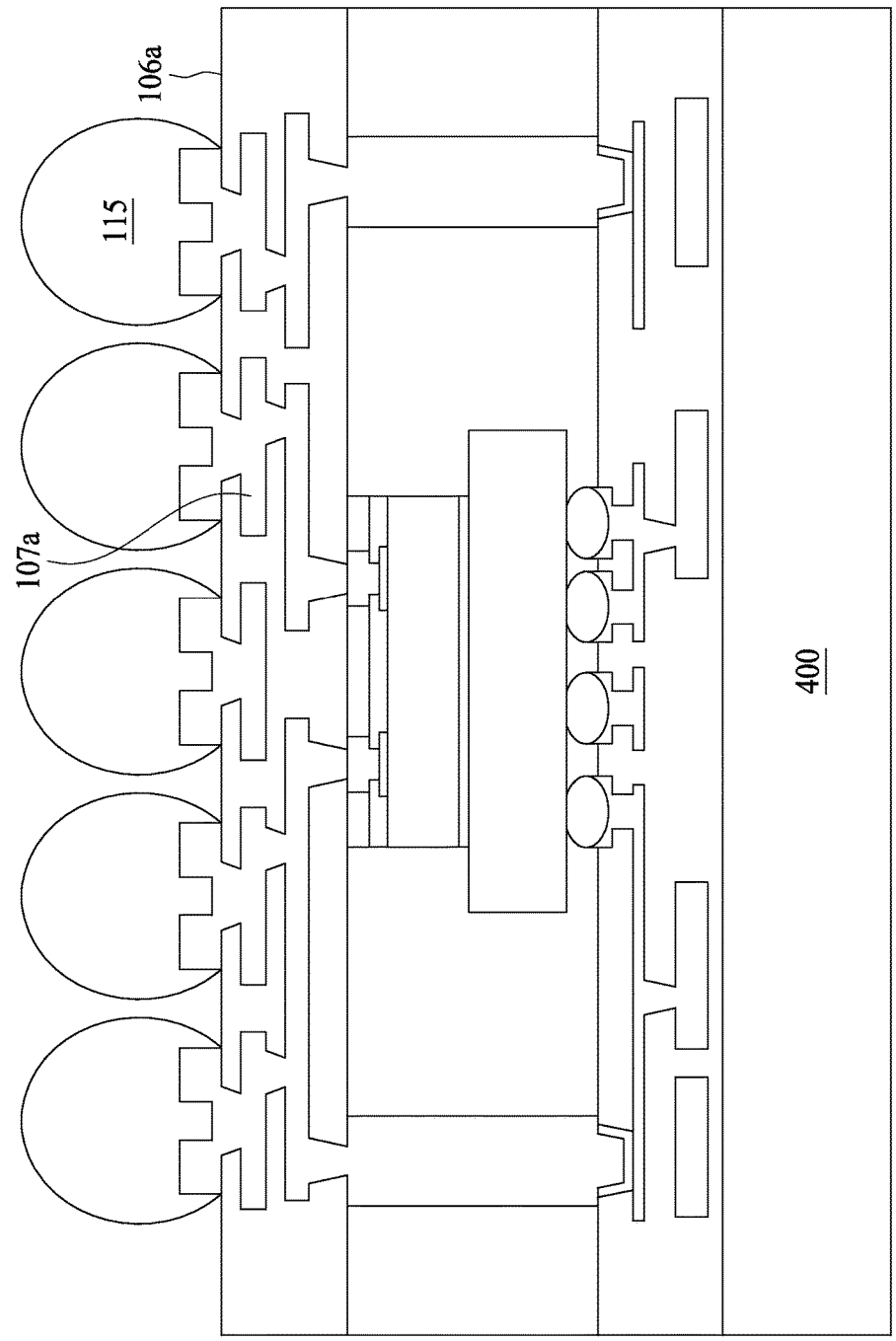

In operation 405, a bump 115 is disposed on the bond pad 114, as in FIG. 6E. In some embodiments, the bump 115 is a solder bump, solder ball, and solder paste or the like. In some embodiments, the bump 115 is configured for attaching with a pad on another die, another substrate or another semiconductor package. In some embodiments, the bump 115 is a conductive bump or a conductive joint. In some embodiments, the first component 102 is electrically connected with the bump 115 through the first portion 107a conductive trace and the bond pad 114.

Figure 6F:
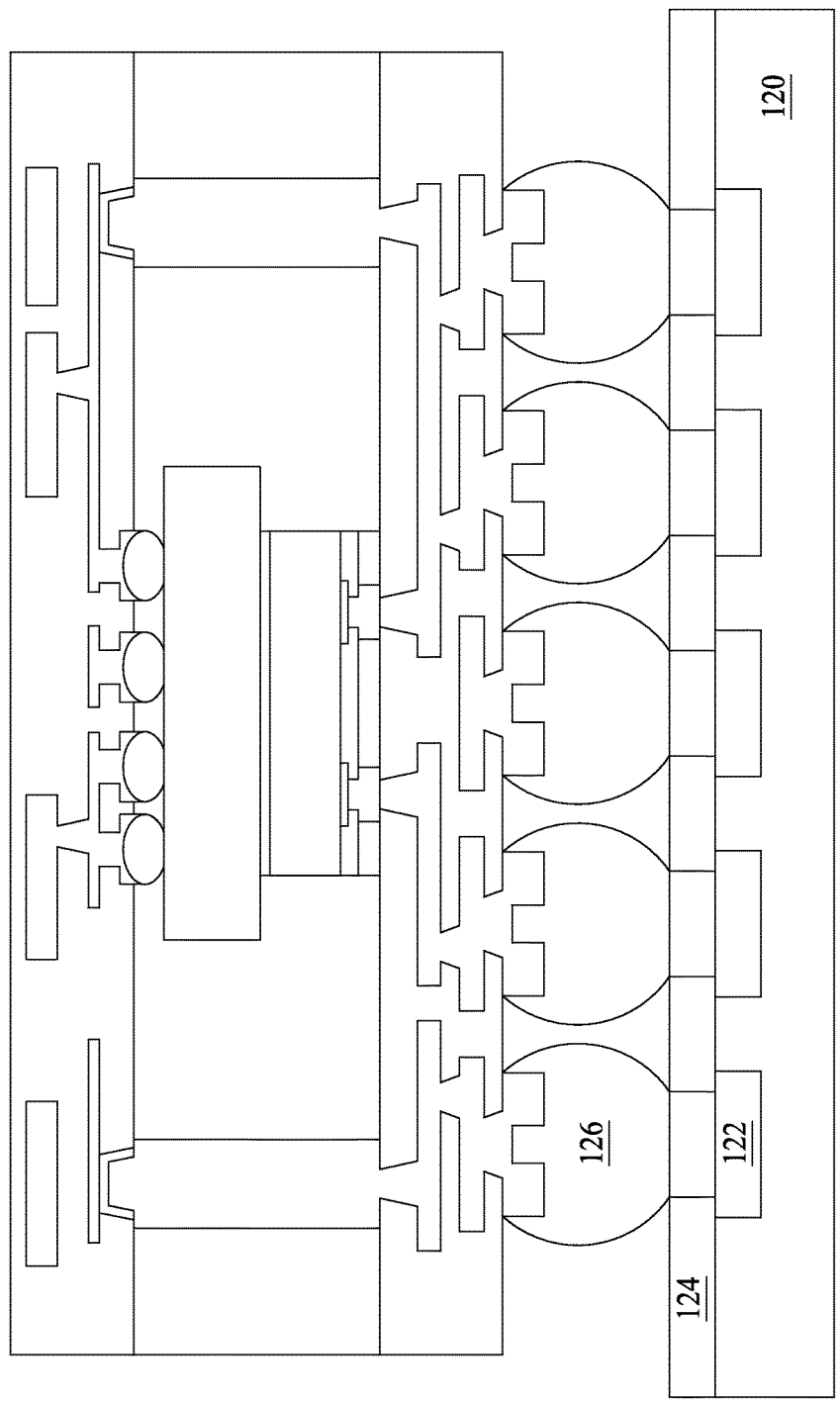

In operation 406, the substrate 400 in FIG. 6E is removed from the semiconductor device, as in FIG. 6F. In some embodiments, the semiconductor device is detached from the substrate 400 for subsequent operations.

The structure shown in FIG. 6E is flipped upside down and attached to another substrate 120 at the bottom of FIG. 6F. The substrate 120 may be a package substrate, board (e.g., a printed circuit board (PCB)), a wafer, a die, an interposer substrate, or other suitable substrate. The bump structure is coupled to the substrate 120 through various conductive attachment points. For example, a conductive region 122 is formed and patterned on the substrate 120. The conductive region 122 is a contact pad or a portion of a conductive trace, which is presented by a mask layer 124. In one embodiment, the mask layer 124 is a solder resist layer formed and patterned on the substrate 120 to expose the conductive region 122. The mask layer 124 has a mask opening, which provides a window for solder joint formation. For example, a solder layer including alloys of tin, lead, silver, copper, nickel, bismuth, or combinations thereof may be provided on the conductive region 122. The semiconductor device can be coupled to the substrate 120 through a joint solder structure 126 between the bond pad 114 and the conductive region 122. An exemplary coupling process includes a flux application, chip placement, reflowing of melting solder joints, and/or cleaning of flux residue. The semiconductor substrate 102, the joint solder structure 126, and the other substrate 120 may be referred to as a packaging assembly, or in the present embodiment, a flip-chip packaging assembly.

In some embodiments, the semiconductor device is bonded with another package by a package bump to become a package on package (PoP). In some embodiments, the semiconductor device is electrically connected with another package through the package bump. In some embodiments, several conductive members of the semiconductor device are correspondingly bonded with several package pads of another package through several package bumps to become a PoP.

FIG. 7A-FIG. 7G includes operations of a method of manufacturing a semiconductor device 100 in FIG. 1. The method includes a number of operations (601, 602, 603, 604, 605, 606 and 607). In operation 601, a semi-manufactured semiconductor device in FIG. 6A is provided, as in FIG. 7A. In operation 602, solder paste is disposed on a top surface 108b of the dielectric 108, as in FIG. 7B. In operation 603, the second component 104 is inserted between the conductive posts 132 and electrically connected to the second portion 107b conductive trace by the solder paste, as in FIG. 7C. In some embodiments, some bumps are disposed on a top surface 104a of the second component 104 and connected to the solder paste to electrically connect the second component 104 to the second portion 107b conductive trace. In operation 604, a first component 102 is stacked on a bottom surface 104b of the second component 104, as in FIG. 7D.

Figure 7A:
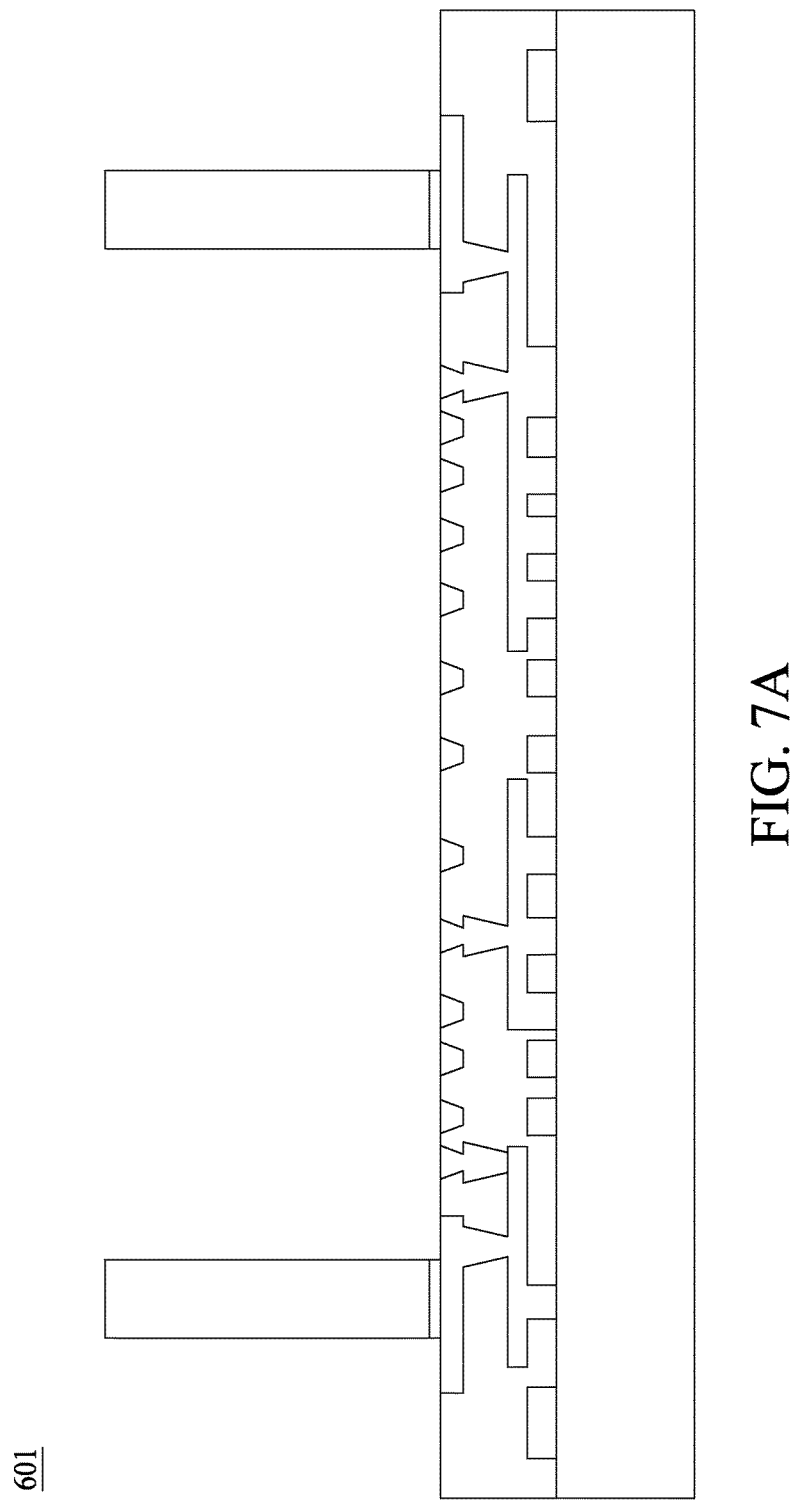
Figure 7B:
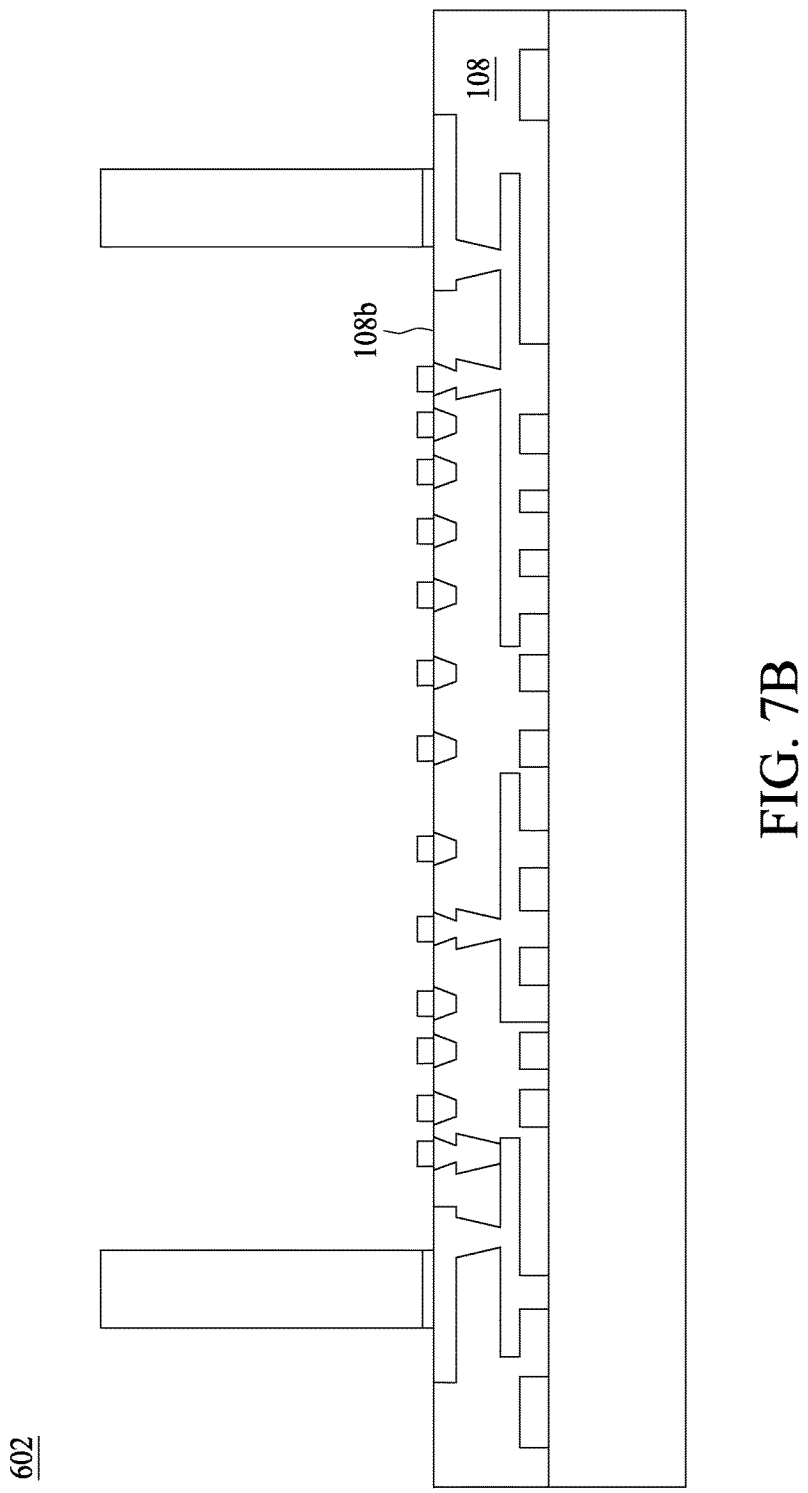
Figure 7C:
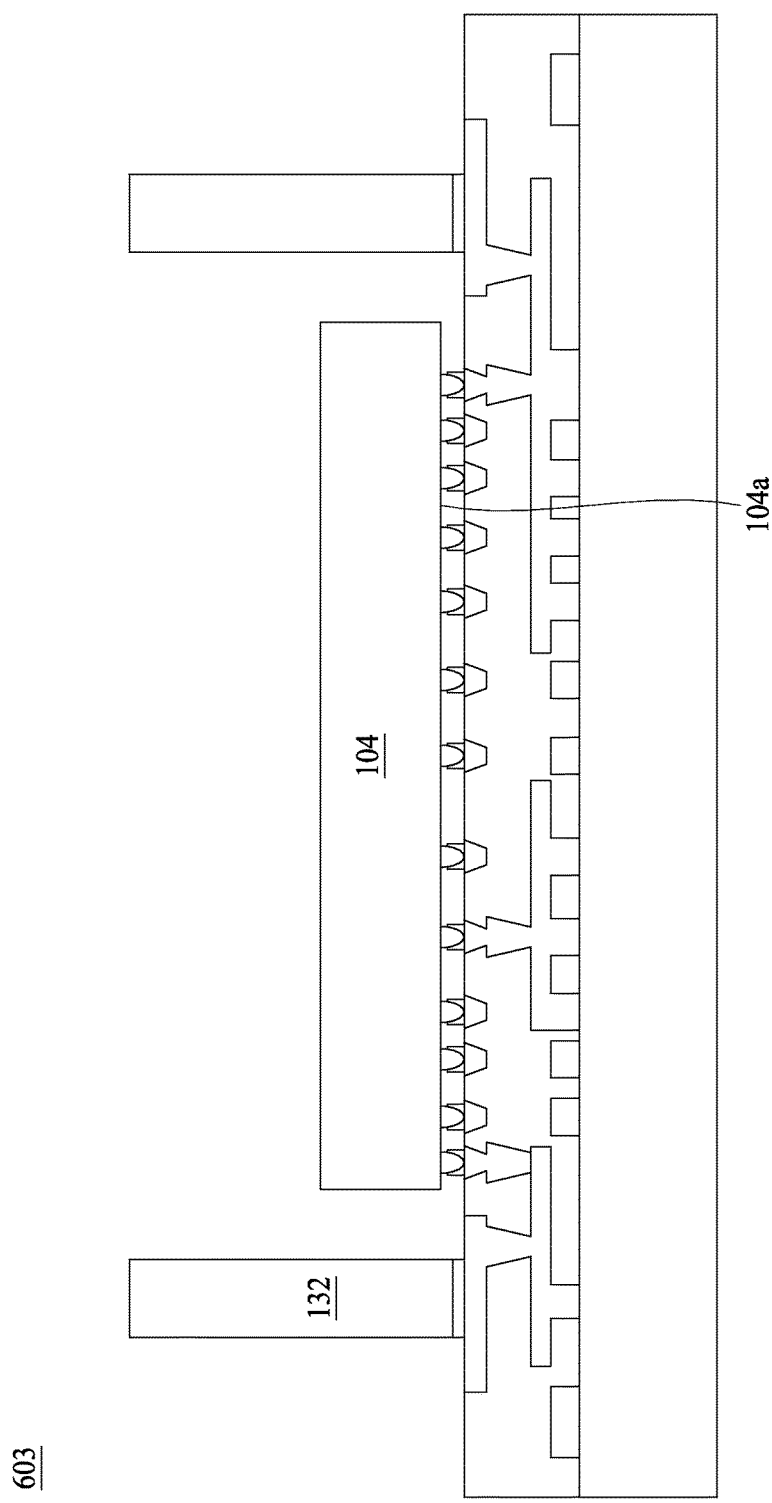
Figure 7D:
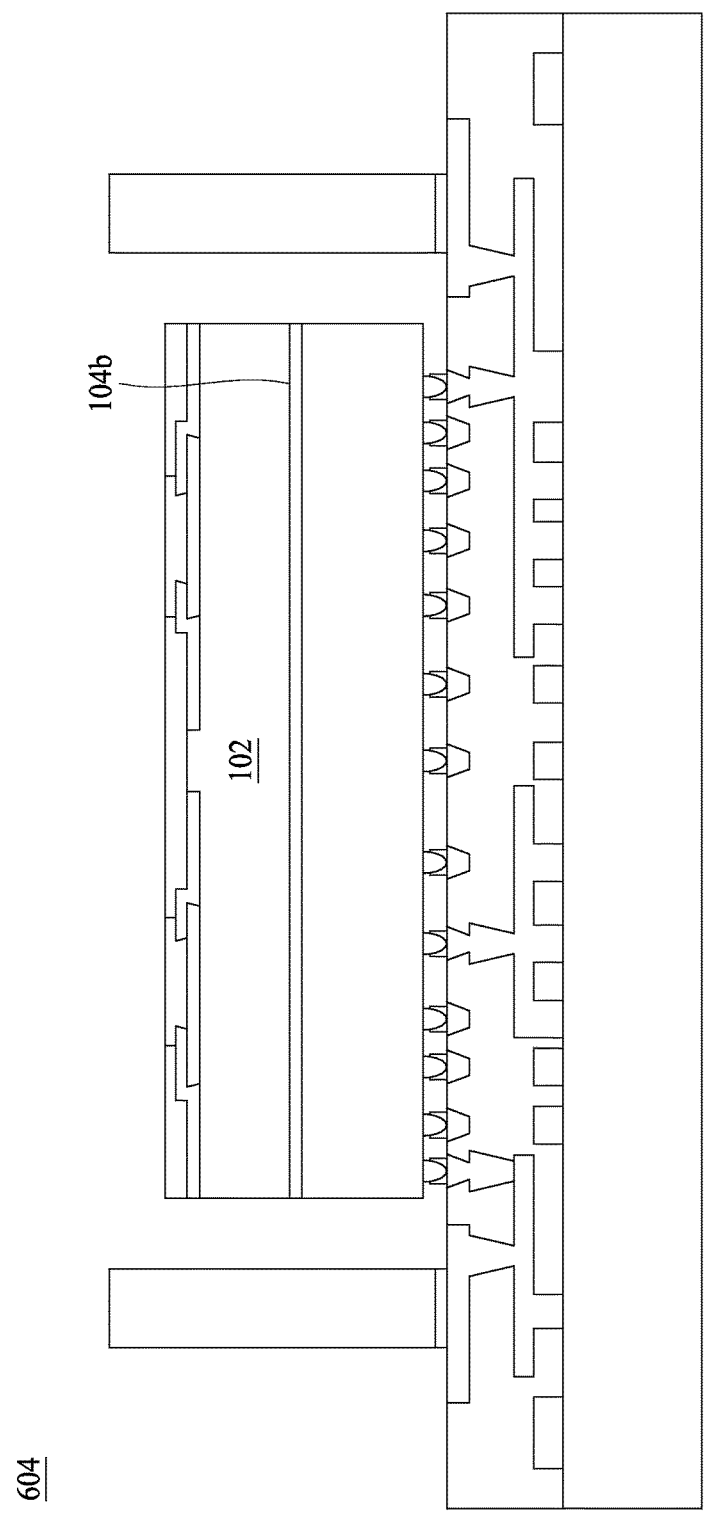
Figure 7E:
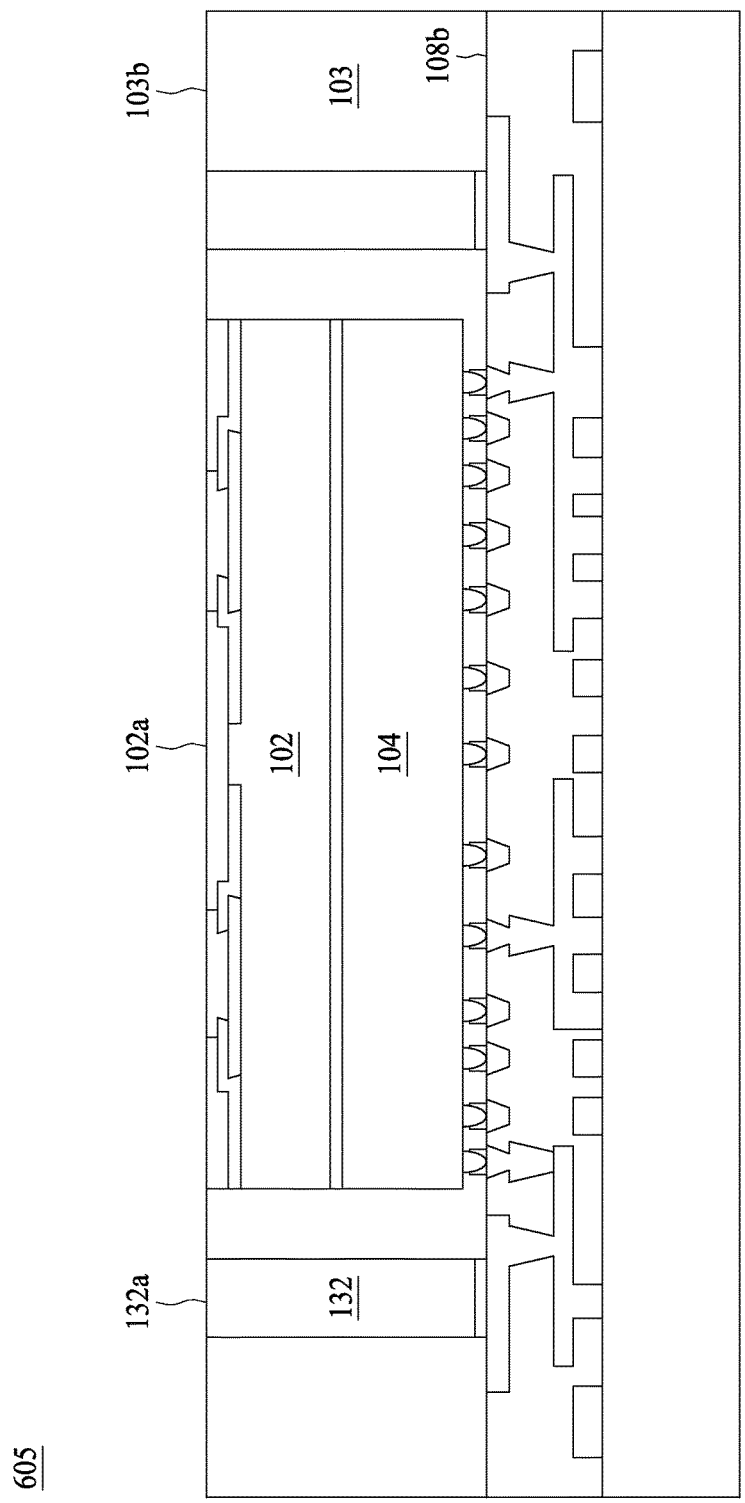
Figure 7F:
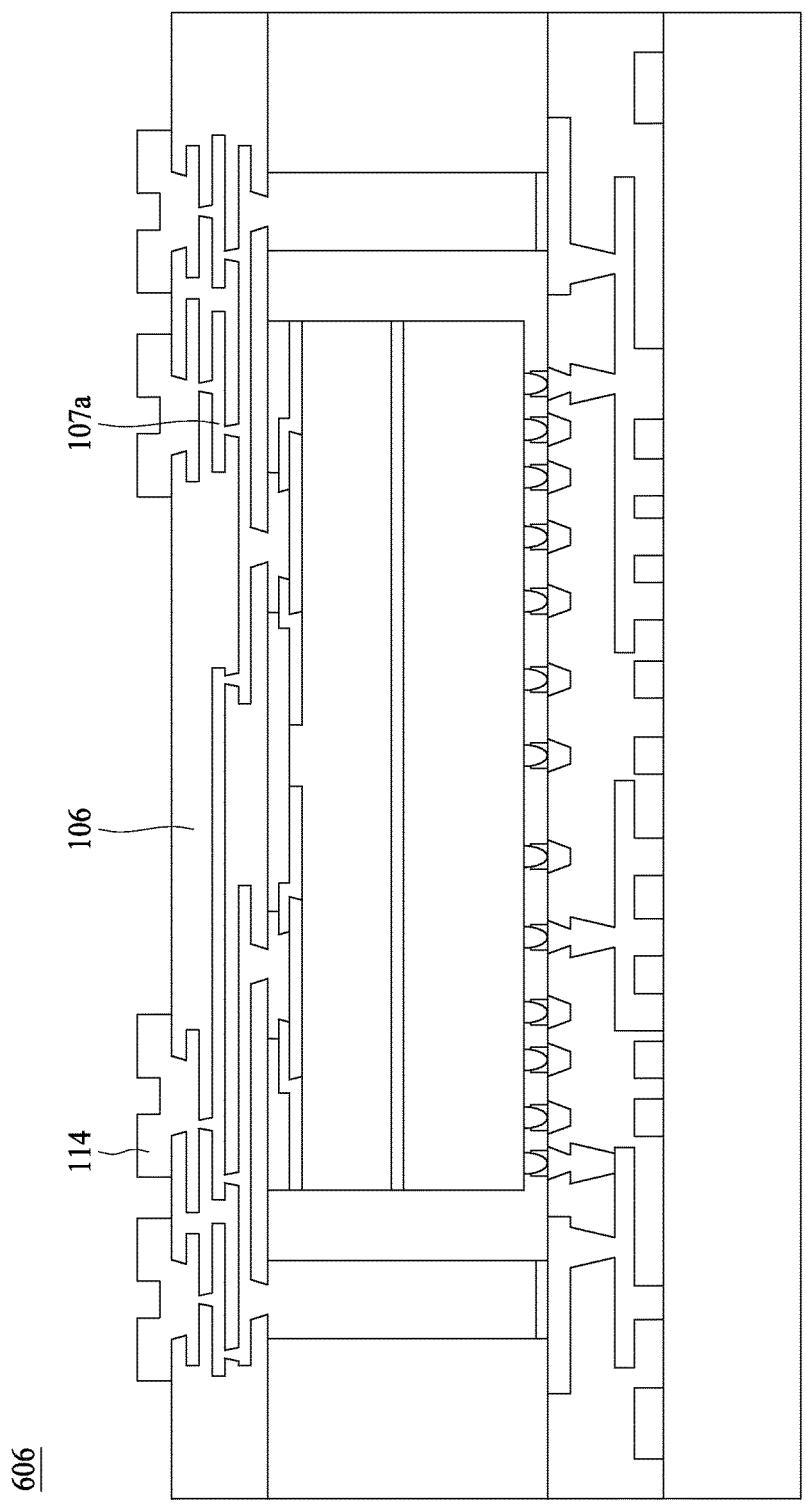

In operation 605, the middle level molding 103 is disposed over the top surface 108b and fills gaps between the conductive posts 132 and the stacked component of the first component 102 and the second component 104, as in FIG. 7E. A grinding operation is introduced to remove excessive molding in order to expose the top surface 132a of the conductive posts 132 and top surface 102a of the first component 102. As shown in FIG. 7E, a planar surface is formed and the contact points of the conductive posts 132 and the first component 102 are exposed in order to receive other conductive structures disposed thereon. In operation 606, a dielectric 106, a first portion 107a conductive trace and a bond pad 114 are formed, as in FIG. 7F. In operation 607, a bump is disposed and the semiconductor device is connected to another substrate, as in FIG. 7G.

In some embodiments, a semiconductor device includes a plurality of semiconductor dies stacked vertically to have a vertical height and a dielectric surrounding the stacked semiconductor dies. The semiconductor device further has a conductive post external to the stacked semiconductor dies and extending through the dielectric. In the semiconductor device, a height of the conductive post is greater than the vertical height.

In some embodiments, a method of manufacturing a semiconductor device includes providing a substrate and disposing a conductive post over the substrate, wherein a height of the conductive post is more than about 250 um. The method further includes stacking a plurality of semiconductor dies vertically over the substrate and adjacent to the conductive post, disposing a dielectric to surround the conductive post and the plurality of semiconductor dies, and electrically connecting the plurality of semiconductor dies through the conductive post.

In some embodiments, a method of manufacturing a semiconductor device includes stacking a plurality of semiconductor dies vertically, providing a substrate and disposing a conductive post over the substrate, wherein a height of the conductive post is more than about 250 um. The method further includes placing the plurality of semiconductor dies adjacent to the conductive post, disposing a dielectric to surround the conductive post and the plurality of semiconductor dies, and electrically connecting the plurality of semiconductor dies through the conductive post.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of semiconductor dies stacked vertically to have a vertical height;
a dielectric surrounding the stacked semiconductor dies; and
a conductive post external to the stacked semiconductor dies and extending through the dielectric; wherein
a height of the conductive post is greater than the vertical height, the plurality of semiconductor dies includes a first component and a second component, and the first component is stacked vertically on the second component, and a width of the first component is less than a width of the second component.

2. The semiconductor device of claim 1, wherein the height of the conductive post is greater than about 250 um.

3. The semiconductor device of claim 1, wherein a width of the conductive post is less than about 285 um.

4. The semiconductor device of claim 1, wherein a difference between the width of the first component and the width of the second component is greater than about 100 um.

5. The semiconductor device of claim 1, further comprising a third component, wherein the third component is stacked vertically on the second component and adjacent to the first component.

6. The semiconductor device of claim 5, wherein a width of the second component is greater than a sum of a width of the first component and a width of the third component.

7. The semiconductor device of claim 1, wherein further comprises a thermal dissipation pad electrically connected to the plurality of semiconductor dies and configured to dissipate a heat from the plurality of semiconductor dies.

8. The semiconductor device of claim 1, wherein the conductive post is configured as a support for the plurality of semiconductor dies.

9. The semiconductor device of claim 1, further comprising a plurality of conductive posts, wherein the plurality of the conductive posts surrounds the plurality of semiconductor dies.

10. A method of manufacturing a semiconductor device, comprising:
providing a substrate;
disposing a conductive post over the substrate, wherein a height of the conductive post is more than about 250 um;
stacking a plurality of semiconductor dies vertically over the substrate and adjacent to the conductive post;
disposing a dielectric to surround the conductive post and the plurality of semiconductor dies; and
electrically connecting the plurality of semiconductor dies through the conductive post.

11. The method of claim 10, wherein stacking the plurality of semiconductor dies comprises stacking a first semiconductor die vertically on a second semiconductor die.

12. The method of claim 11, wherein a width of the second semiconductor die is substantial greater than a width of the first semiconductor die.

13. The method of claim 11, wherein a difference of the width of the second semiconductor die and the width of the first semiconductor die is greater than 100 um.

14. A method of manufacturing a semiconductor device, comprising:
stacking a plurality of semiconductor dies vertically;
providing a substrate;
disposing a conductive post over the substrate, wherein a height of the conductive post is more than about 250 um;
placing the plurality of semiconductor dies adjacent to the conductive post; and
disposing a dielectric to surround the conductive post and the plurality of semiconductor dies; and
electrically connecting the plurality of semiconductor dies through the conductive post.

15. The method of claim 14, wherein stacking the plurality of semiconductor dies comprises singulating a wafer level package into the plurality of semiconductor dies.

16. The method of claim 14, further comprising removing a portion of the dielectric to expose a top surface of the conductive post and a top surface of the plurality of semiconductor dies.

17. The method of claim 16, wherein removing a portion of the dielectric is performed by etching or grinding.

* * * * *